United States Patent [19]

Jönsson

[11] Patent Number: 4,650,990

[45] Date of Patent: Mar. 17, 1987

[54] PROCESSOR-CONTROLLED LIGHT SCREEN WHEREIN LIGHT BEAM CARRIES CODED SIGNALS

[76] Inventor: Nils Jönsson, Högstigen 10, Stocksund, Sweden

[21] Appl. No.: 745,048

[22] Filed: Jun. 13, 1985

Related U.S. Application Data

[63] Continuation-in-part of Ser. No. 642,680, Aug. 16, 1984, abandoned.

[51] Int. Cl.$^4$ .......................... G01V 9/04; G06M 7/00
[52] U.S. Cl. .................................. 250/221; 340/556
[58] Field of Search .............................. 250/221, 222.2; 340/555, 556, 557; 455/607, 608

[56] References Cited

U.S. PATENT DOCUMENTS

| | | | |
|---|---|---|---|
| 3,742,222 | 6/1973 | Endl | 250/209 |
| 3,825,745 | 7/1974 | Thomson | 250/221 |
| 4,266,124 | 5/1981 | Weber | 250/221 |
| 4,294,682 | 10/1981 | Deczky | 455/607 |
| 4,309,696 | 1/1982 | Nagai | 250/221 |
| 4,514,625 | 4/1985 | Heiland | 250/221 |

Primary Examiner—David C. Nelms
Assistant Examiner—William L. Oen
Attorney, Agent, or Firm—Brumbaugh, Graves, Donohue & Raymond

[57] ABSTRACT

A processor-controlled light screen system comprises spaced-apart Master and Slave units each having a plurality of light transmitters and light receivers. Each transmitter in the Master unit or Slave unit is adapted to provide a light beam carrying a respective binary coded signal to a corresponding receiver in the unit to enable the two otherwise independent units to interactively communicate with one another. The Master and Slave units respectively include a Master processor and a Slave processor, each programmed to sequentially actuate the transmitters and receivers in their respective units in pairs. Operation is initiated by the Master processor program which causes the transmitter of the first actuated transmitter-receiver pair of the Master unit to send its respective coded signal. The programs of both processors are responsive to the reception of an appropriately coded signal by an actuated receiver in their respective units for causing the next transmitter to be actuated therein to send its respective coded signal. In this manner the region of space between the Master and Slave units are scanned by the light beams passing between corresponding transmitters and receivers. The scanning occurs in repetitive cycles so long as all coded signals are correctly exchanged between the Master and Slave units. If a coded signal is not received, as a result of either the blockage of a beam by an object or a malfunction of the system, scanning is aborted and the two processors enter respective alarm states and issue alarm state signals.

7 Claims, 6 Drawing Figures

Microfiche Appendix Included
(1 Microfiche, 28 Pages)

PROCESSOR-CONTROLLED LIGHT SCREEN WHEREIN LIGHT BEAM CARRIES CODED SIGNALS

CROSS REFERENCE TO RELATED APPLICATIONS

This is a continuation-in-part of U.S. patent application Ser. No. 642,680, filed on Aug. 16, 1984, which is now abandoned.

A Microfiche Appendix containing 28 frames on one card is included in the specification and is hereafter referred to as Appendix I.

BACKGROUND OF THE INVENTION

The present invention relates to photoelectric object sensing apparatus, and more particularly to photoelectric object sensing apparatus of the type commonly referred to as light screens, in which a plurality of light beams and corresponding light detectors define a region of space where objects that interrupt or block one or more of the beams are sensed.

In accordance with the prior art, it is known to use light screen systems comprising a plurality of light beam transmitters and a plurality of corresponding light receivers, each positioned to receive a beam of light from a respective one of the transmitters, for sensing the presence of objects within a region of space between the transmitters and receivers. Such systems are commonly used in safety control equipment for dangerous machines, such as power operated presses and other automatic machines and robots, to actuate an alarm or to cause the stoppage of the machine when the presence of an object, such as an operator's hand, is sensed in an unsafe zone of the machine. Since the purpose of machine safety control equipment is to safeguard against accidents, light screen systems used in such equipment must be highly reliable and fail-safe. Ideally, the failure of any component which can result in a malfunction of the system should produce the same response as when an object is sensed by the system. Known light screen systems constructed entirely with hard-wired circuitry generally provide only a limited degree of safety from component failures.

In addition to being reliable and fail-safe, light screen systems used in machine safety control equipment must also have a high degree of immunity to spurious actuations caused by disturbances such as electrical transients, ambient light, vibration, aging of components, smoke or dust particles. Spurious actuations are highly undesirable in that they result in false alarms or unnecessary stoppages of the machine. In known light screen systems, immunity to spurious actuations can generally be achieved only at the expense of the sensitivity of the system to objects that are intended to be sensed. Consequently, in such systems there must be a compromise between reliability of sensing and immunity to spurious actuations.

Accordingly, a need exists for a highly reliable light screen system which provides a high degree of safety from component failures as well as a high degree of immunity against spurious actuations.

SUMMARY OF THE INVENTION

The deficiencies of the prior art as described above are substantially overcome by the present invention which is a processor-controlled light screen comprising first and second spaced apart holders respectively positioned on oppposite sides of a region of space where objects are to be sensed, each holder having a plurality of alternating light transmitters and light receivers. Each of the transmitters in the first or the second holder is adapted for sending a light beam carrying a respective coded signal towards a corresponding receiver in the other holder. The transmitter and receivers of the first holder are operatively coupled to a first processor, such as an integrated circuit microprocessor, programmed to sequentially actuate the transmitter and receivers in the first holder in pairs. In addition, the first processor is programmed to be responsive to a respective coded signal received by the receiver of an actuated pair in the first holder for actuating the next pair in the sequence therein and for causing the transmitter of the next pair to send its respective coded signal to a corresponding receiver in the second holder. Furthermore, the first processor is programmed to enter an alarm state and to provide an alarm state signal, if the receiver of an actuated transmitter-receiver pair in the first holder fails to receive the respective coded signal transmitted by its corresponding transmitter during a predetermined interval of time for receiving such a coded signal. The transmitters and receivers in the second holder are operatively coupled to a second processor programmed to sequentially actuate the transmitters and receivers in the second holder in pairs corresponding to the actuation of the transmitter-receiver pairs in the first holder. In addition, the second processor is programmed to be responsive to the receiver of an actuated pair in the second holder receiving the respective coded signal from its corresponding transmitter for causing the transmitter of that pair to send its respective coded signal to its corresponding receiver in the first holder and for actuating the next transmitter-receiver pair in the sequence in the second holder. The second processor is also programmed to enter an alarm state and to provide an alarm state signal, if the receiver of an actuated pair in the second holder fails to receive the respective coded signal from its corresponding transmitter during a predetermined interval of time for receiving such a coded signal.

In an exemplary embodiment of the invention, the first processor is programmed to serve as a Master for initiating the operation of the light screen by causing the transmitter of the first actuated transmitter-receiver pair in the first holder to send its respective coded signal to its corresponding receiver in the second holder. In addition, the second processor is programmed to serve as a Slave in that it waits for the receiver of the first actuated transmitter-receiver pair in the second holder to receive the respective coded signal from its corresponding transmitter before causing the transmitter of that pair to send its respective coded signal. Furthermore, the first processor is programmed to reinitiate operation of the light screen following its entry into the alarm state by causing the first actuated transmitter-receiver pair in the first holder to send its respective coded signal.

BRIEF DESCRIPTION OF THE DRAWINGS

The invention will now be described in more detail with reference to the accompanying drawings, in which.

DETAILED DESCRIPTION

Figure 1:
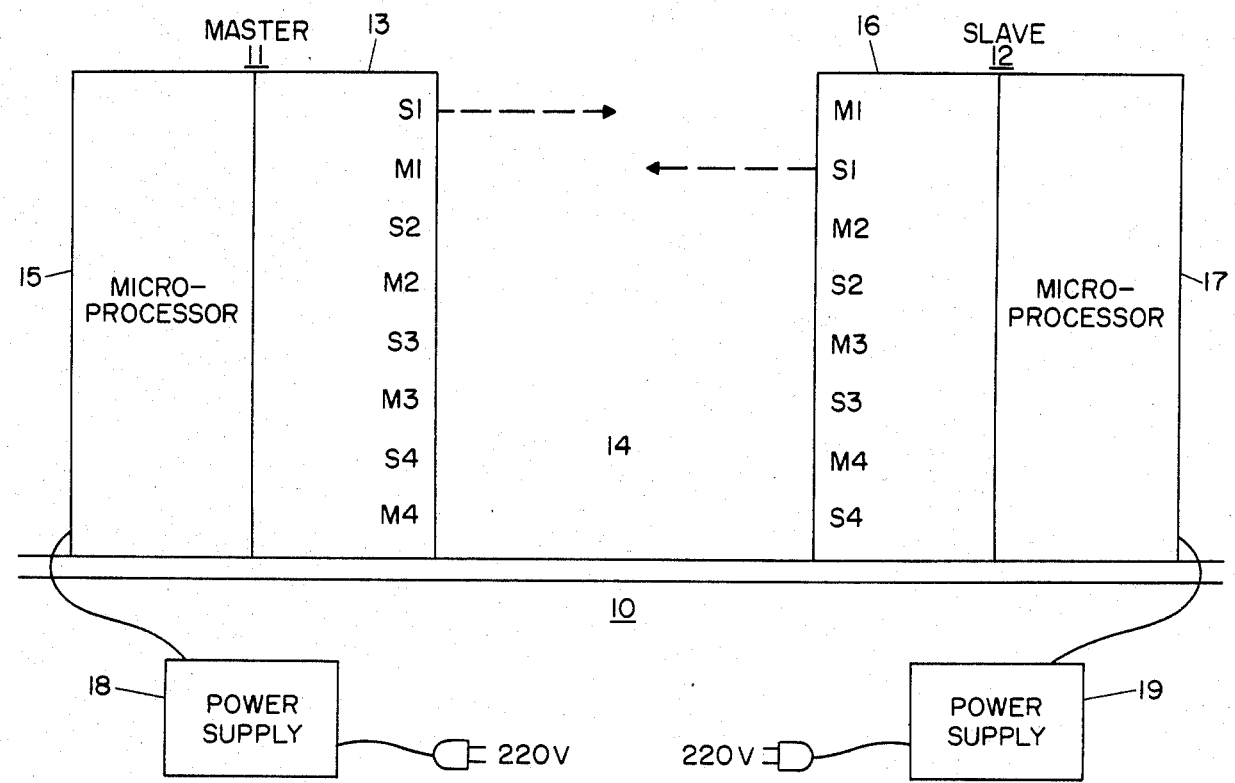
FIG. 1 is a block diagram illustrating a light screen system in accordance with the present invention.

Referring now to FIG. 1, there is shown a block diagram of an exemplary light screen system 10 according to the present invention. The system comprises a Master unit 11 and a Slave unit 12. The Master unit 11 includes a holder 13 positioned at one side of a region of space 14 where objects are to be sensed; and a Master processor 15. The holder 13 serves as a fixture for four light transmitters S1, S2, S3 and S4 and four light receivers M1, M2, M3 and M4. It is noted that the light screen system in accordance with the present invention is not restricted to using four transmitter-receiver pairs, since any number of pairs may be used. In general, the security provided by the system will increase with the number of transmitter-receiver pairs used.

The Slave unit 12 includes a holder 16 positioned at the other side of the region of space 14 opposite the holder 13 of the Master unit 11, and a Slave processor 17. The holder 16 serves as a fixture for four light transmitters S1, S2, S3 and S4, each corresponding to a respective one of the receivers in the other holder 13 and four receivers M1, M2, M3 and M4, each corresponding to a respective one of the transmitters in the other holder 13. The transmitters and receivers in each one of the holders 13 and 16 are advantageously arranged in a row of alternating transmitters and receivers in opposing relationship with corresponding transmitters and receivers in the other holder, such that each transmitter is positioned to send a beam of light to its corresponding receiver. As will be explained hereinafter, the light beam emanating from each transmitter is modulated with a respective binary code for communication between the Master and Slave units 11 and 12 to enable the two otherwise independent units to operate in an interactive manner.

The Master and Slave processors 15 and 17 are both digital processors preferably with stored programs which control the transmitters and receivers in their respective units 11 and 12. The processors 15 and 17 are advantageously constructed with identical components and circuitry on separate circuit cards housed in their respective units and energized by separate power supplies 18 and 19. Although the Master and Slave Processors 15 and 17 have identical hardware, they execute complementary programs as will be explained hereinafter.

Figure 2:
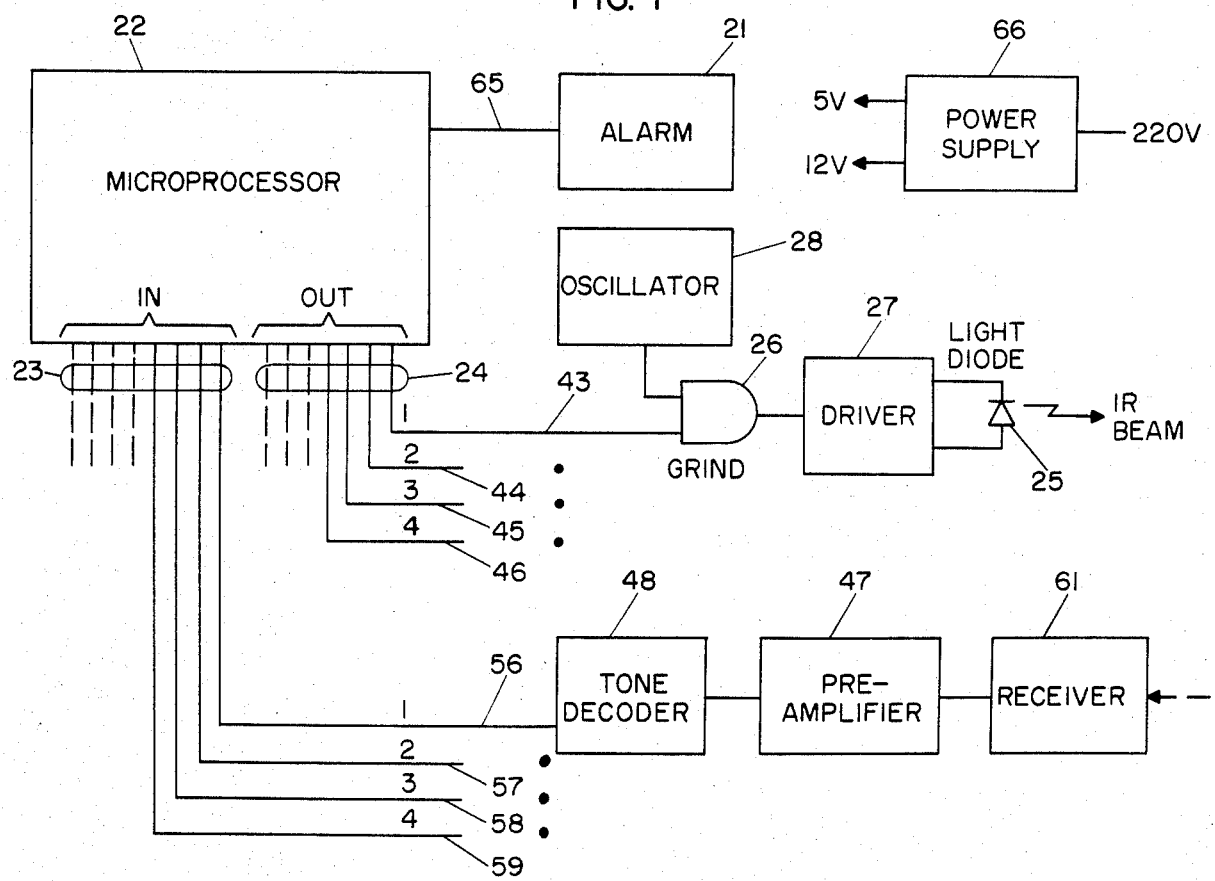
FIG. 2 is a block diagram representative of either the Master or Slave unit of a light screen system constructed in accordance with the present invention.

Turning now to FIG. 2, there is shown a block diagram representing either the Master unit 11 or the Slave unit 12 of the light screen system of FIG. 1. As described above, the Master and Slave units are identical except of the order in which the transmitters and receivers are alternatingly positioned in their respective holders. The processor 22 of the illustrated unit has eight input data lines 23 and eight output data lines 24. Four of the output data lines 43-46 are each operatively coupled to one of four light emitting diodes 25 through an AND gate 26 and a driver (current amplifier) 27. For simplicity of illustration, coupling to only one of the light emitting diodes is depicted in FIG. 2. Each of the light emitting diodes 25 serves as a transmitter for emitting a beam of infrared (IR) light when supplied with an appropriate current by the driver 27. The AND gate 26 has two inputs, one of which is connected to an output data line 43 of the processor 22 and the other of which is connected to a 42 kHz oscillator 28. In this manner, the output of the oscillator is logically "ANDed" with the data signals on the output data line 43. Thus, when the AND gate 26 is enabled by a logic "1" signal on the output data line 43, the light emitting diode 25 is driven by a 42 kHz current signal to provide a light beam modulated by a 42 kHz signal.

Four of the input data lines 56-59 of the processor 22 are each operatively coupled to one of four light receivers 61 through a preamplifier 47 and a tone decoder 48. For simplicity of illustration, coupling to only one of the the receivers is depicted in FIG. 2. Each light receiver 61 may comprise a photodiode or phototransistor responsive to IR light of the wavelength emitted by the light emitting diodes for providing a corresponding electrical signal which is amplified by the preamplifier 47 before being applied to the decoder 48. The decoder 48, which includes phaselocked circuitry, is responsive to a 42 kHz signal for providing a logic "1" digital signal on input data line 56 of the processor 22.

It is advantageous to employ receivers that respond only to a relatively narrow band of the optical spectrum centered about the wavelength of the IR light emitted by the light emitting diodes. Such narrow band response receivers may be implemented by interposing narrow-band optical filters in front of the photodiodes or phototransistors of the receivers. The use of IR light beams and narrow band response receivers in conjunction with tone encoding and decoding of the light beams provides the light screen system with a very high degree of immunity from disturbances caused by ambient light.

The processor 22 is also connected to an alarm circuit 21 via a signal line 65. As will be further explained hereinafter, when the processor enters an alarm state, it issues an alarm state signal to the alarm circuit 21 to cause an audible or visual alarm, or the activation of a relay or like device for stopping a machine.

Also shown in the block diagram of FIG. 2 is the power supply 66 for energizing the components of the block diagram.

Figure 3:
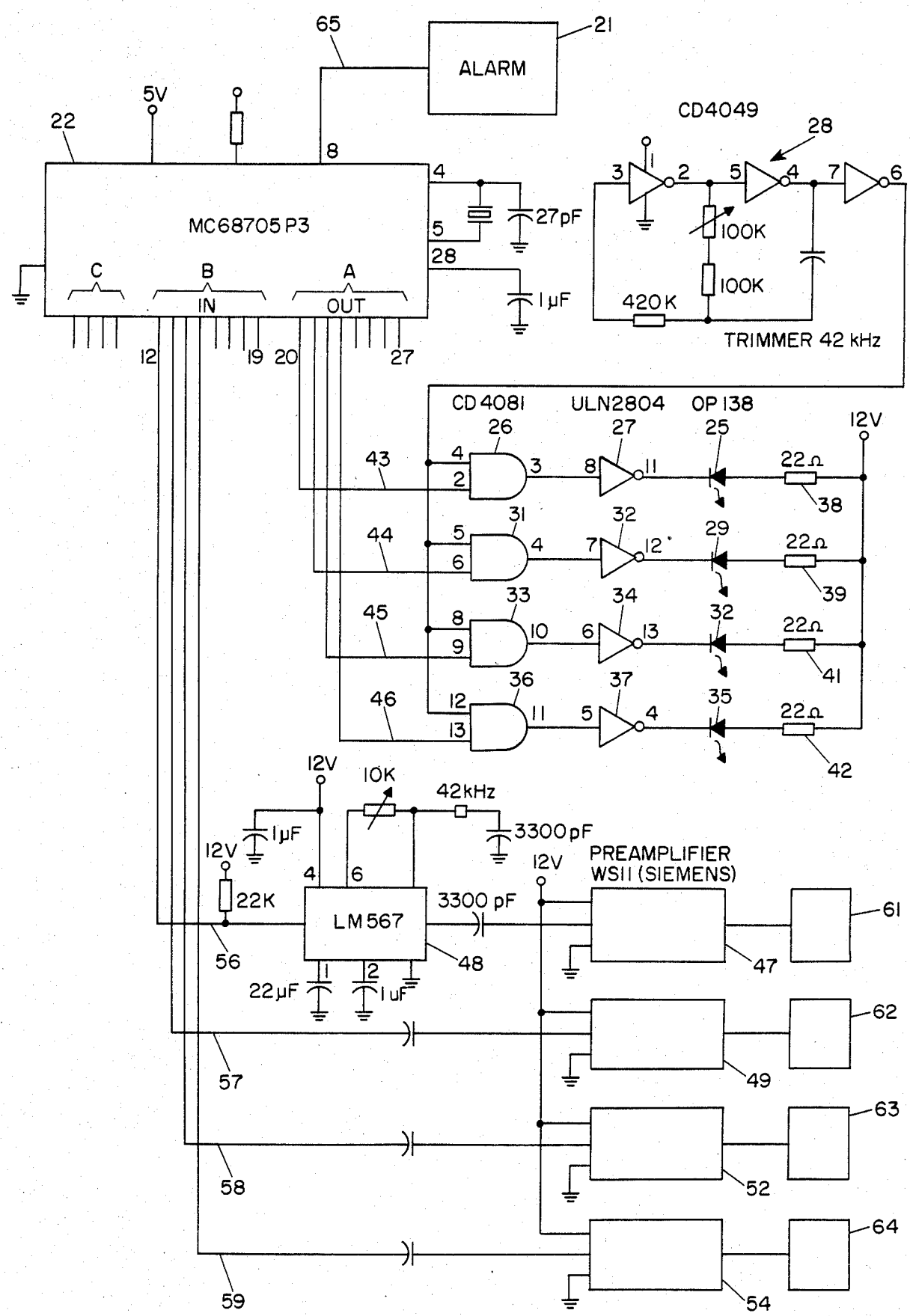
FIG. 3 is a schematic circuit diagram illustrating an exemplary circuit implementation of the block diagram of FIG. 2.

Referring now to FIG. 3, there is shown a schematic circuit diagram of an advantageous implementation of the light screen unit illustrated in FIG. 2. The same reference numerals and characters used in FIG. 2 are again used in FIG. 3 to denote like components or elements of the unit. The processor 22 may be a type MC68705 P3 integrated circuit microprocessor. The light emitting diodes 25, 29, 32 and 35 may be of type OP136. Each light emitting diode is connected in series with a 22 ohm Ω current limiting resistor 38, 39, 41 and 42. The AND gates 26, 31, 33 and 36 may all be an integrated circuit of type CD4081. The drivers 27, 32, 34 and 37 may all be a circuit of type ULN2804. The oscillator 28 may be a circuit of type CD4049. The preamplifiers 47, 49, 52 and 54 may be type WS11 tone amplifiers manufactured by Siemens AG. The tone decoders 48 may be circuits of type LM567.

Figure 4:
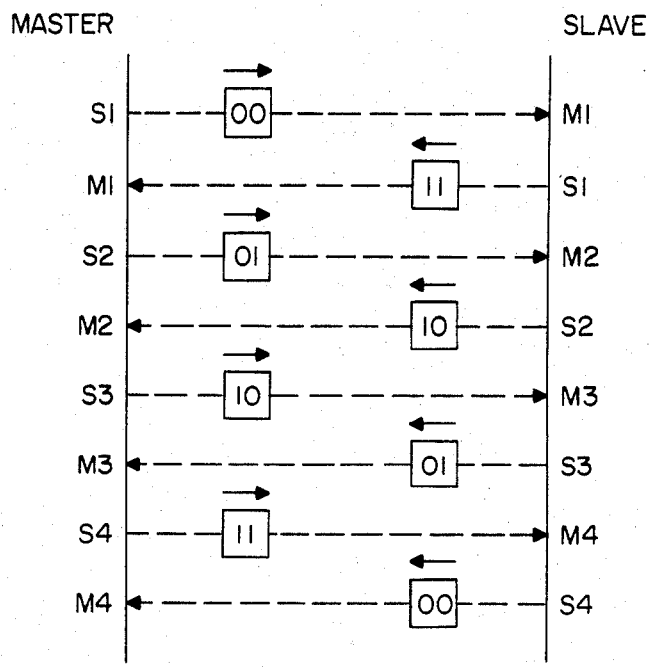
FIG. 4 is a diagram illustrating an example of the respective binary coded signals that are exchanged between the Master and Slave units of a light screen system in accordance with the present invention.

Turning now to FIG. 4 there is shown a diagram illustrating the coded signals that are used for interactive communication between the Master and Slave units of the light screen system. In addition to being modulated with a 42 kHz signal, the light beam from each transmitter in the Master and Slave units is also modulated with a respective digital code provided by its respective processor. In FIG. 4, the transmitter in both the Master and Slave units are designated S1, S2, S3 and S4, while the receivers in both units are designated M1, M2, M3 and M4. Both the Master and Slave processors are programmed to sequentially actuate the transmitters and receivers in their respective units in pairs, i.e., in the order S1-M1, S2-M2, S3-M3 and S4-M4.

Operation of the light screen is initiated by the program in the Master processor which at the start of operation causes the transmitter S1 in the Master unit to send a "00" binary coded signal to its corresponding receiver M1 in the Slave unit. The program in the Slave processor responds to the reception of the "00" signal by the receiver M1 in the Slave unit by causing the transmitter S1 therein to send a "11" binary coded signal to its corresponding receiver M1 of the Master unit and by actuating the next pair S2-M2 in the sequence in the Slave unit. The Master processor program responds to the reception of the "11" signal by the receiver M1 of the Master unit by actuating the next pair S2-M2 in the sequence therein and by causing the transmitter S2 of that pair to send a "01" binary coded signal to its corresponding receiver M2 in the Slave unit. The Slave processor program responds to the reception of the "01" signal by the receiver M2 of the Slave unit by causing the transmitter S2 therein to send a "10" binary coded signal to its corresponding receiver M2 of the Master unit and by actuating the next pair S3-M3 in the sequence in the Slave unit. The Master processor program responds to the reception of the "10" signal by the receiver M2 of the Master unit by actuating the next pair S3-M3 in sequence in the Master unit and by causing the transmitter S3 of that pair to send a "10" signal to its corresponding receiver M3 of the Slave unit. The Slave processor program responds to the reception of the "10" signal by the receiver M3 of the Slave unit by causing the transmitter S3 of that unit to send a "01" binary coded signal to its corresponding receiver M3 in the Master unit and by actuating the next pair S4-M4 in sequence in the Slave unit. The Master processor program responds to the reception of the "01" signal by the receiver M3 of the Master unit by actuating the next pair S4-M4 in sequence therein and by causing the transmitter S4 of that pair to send a "11" binary code to its corresponding receiver M4 of the Slave unit. The Slave processor program responds to the reception of the "11" signal by the receiver M4 of the Slave unit by causing the transmitter S4 therein to send a "00" binary coded signal to its corresponding receiver M4 of the Master unit and by actuating the first pair S1-M1 in the Slave unit. The Master processor program responds to the reception of the "00" signal by the receiver M4 of the Master unit by actuating the first pair S1-M1 of the Master unit and by causing the transmitter S1 of that pair to send the "00" signal to its corresponding receiver M1 in the Slave unit. If all the coded signals are successfully exchanged between the Master and Slave units, scanning of the light screen by the light beams passing between the corresponding transmitters and receivers continues until completion and a new scan is initiated. It is noted that the Slave processor program causes each transmitter in the Slave unit to send a binary coded signal that is the inverse of the coded signal last received by the Slave unit.

In the absence of any objects in the region of space between the Master and Slave units to block any of the light beams passing therebetween and in the absence of any malfunction of the system, the light screen is scanned to completion in repetitive cycles as described above. However, in the event that any one of the receivers fails to receive the respective coded signal from its corresponding transmitter, as a result of a blocked beam or a system malfunction, the Master and Slave processors are each programmed to respond to such a failure of reception by a receiver coupled thereto by entering into an alarm state. In the alarm state the processor issues an alarm state signal to the alarm circuit connected to the processor and reinitializes the actuation of the transmitter-receiver pairs coupled to the processor to the beginning of the sequence. For example, if an object blocks the beam passing from the transmitter S2 of the Master unit to the receiver M2 of the Slave unit, the Slave processor program waits a predetermined time interval, e.g., 5 ms, for the receiver M2 of the Slave unit to receive the "01" signal from the transmitter S2 in the Master unit before entering the alarm state. Thereafter, the Slave processor program waits for the receiver M1 of the Slave unit to receive the "00" signal from the transmitter S1 of the Master unit.

In the meanwhile, the Master processor program waits a predetermined time interval, e.g., a few milliseconds, after the transmitter S2 of the Master unit has sent the "01" signal for the receiver M2 of the Master unit to receive the "01" signal. Since the receiver M2 of the Slave unit did not receive the "01" signal, the Slave processor program did not cause the transmitter S2 of the Slave unit to send the "10" signal. Therefore, the receiver M2 of the Master unit does not receive the "10" signal during the predetermined time interval, and the Master processor also enters the alarm state. Thereafter the Master processor program causes the transmitter S1 of the Master unit to send the "00" signal thereby initiating a new scan of the light screen.

Thus, if any of the coded signals exchanged between the Master and Slave units fails to be received, as a result of either a blockage of a beam or a malfunction of the system, the scanning of the light screen is aborted and both the Master and Slave processors enter their respective alarm states. If the blockage or malfunction persists, the Master and Slave processors remain in their respective alarm states and only partial scanning of the light screen takes place. However, if the blockages or malfunction is removed, the alarm states of the Master and Slave processors are removed, and full scan cycles are resumed. Therefore, each processor monitors not only its own operation and that of the components in its respective unit, but also the operation of the other processor and of the components of the other unit. For that reason, the light screen system described herein provides a very high degree of safety from failures of components in the system. Furthermore, because communication between the Master and Slave units takes place by means of specific coded signal transmitted during specific time intervals, the light screen system has a very high degree of immunity from spurious actuations caused by random disturbances.

Figure 5:
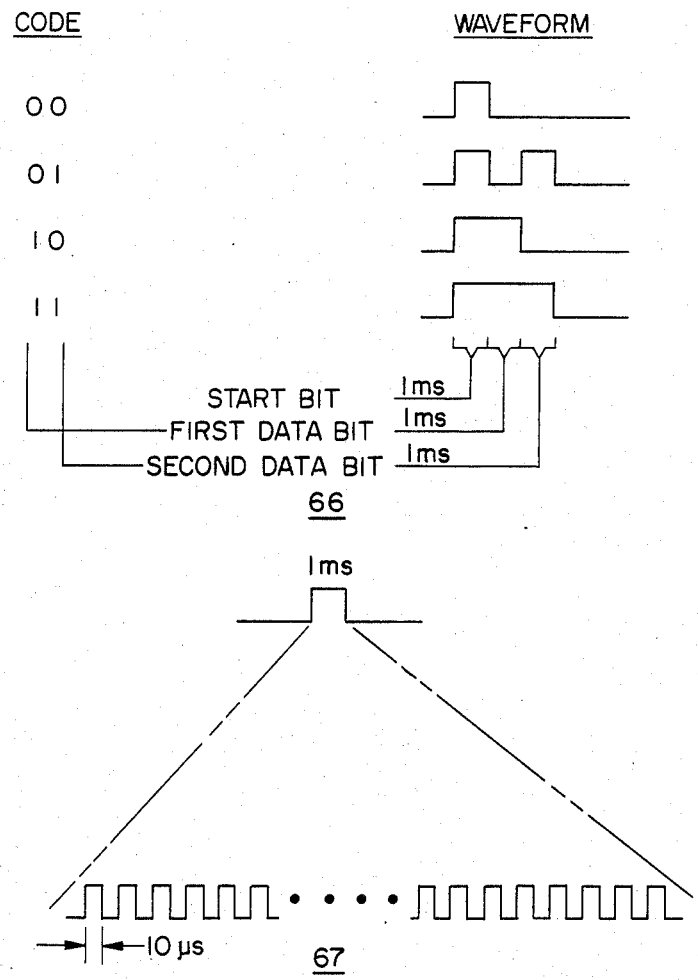
FIG. 5 illustrates the waveforms of the binary coded signals exchanged between the Master and Slave units of a light screen system in accordance with the present invention.

Turning now to FIG. 5, there are shown waveforms 66 respresenting the binary coded signals exchanged between the Master and Slave units and a waveform 67 representing a burst of pulses corresponding to a logic 1" bit of the coded signals. Each binary coded signal consists of two positive logic data bits preceded by a logic "1" start bit. Each of the data bits and the start bit has a duration of 1 ms.

As explained above in connection with FIGS. 2 and 3, each light beam passing between the Master and Slave units is modulated with a respective coded signal as well as with a 42 kHz tone. Therefore, each logic "1" bit of the coded signal is transmitted as a 1 ms burst of 42 kHz light pulses, as illustrated by waveform 67.

Figure 6:
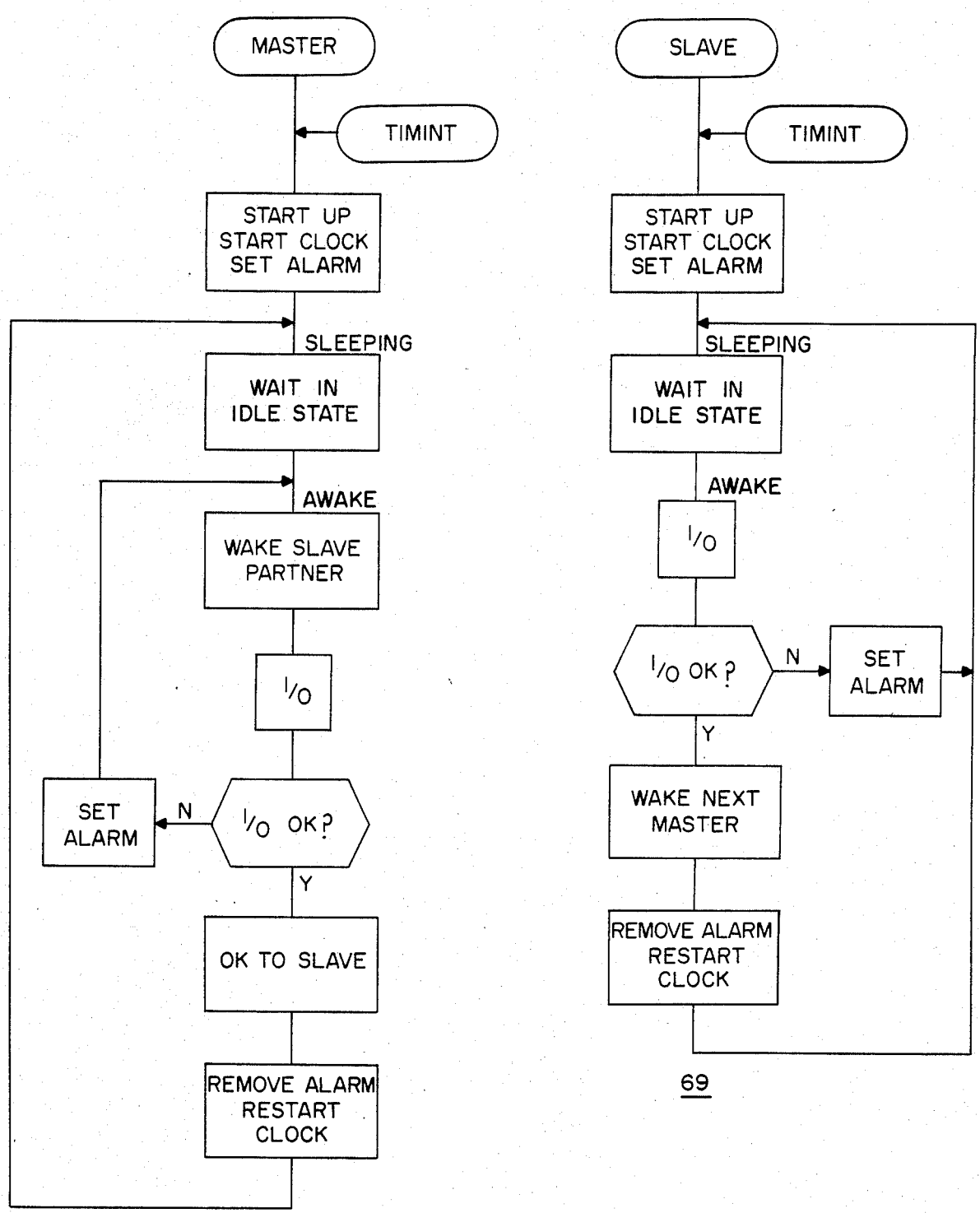
FIG. 6 illustrates the flow diagrams of the programs of the Master and Slave processors.

The program for the Master processor is entitled MASTER. A flow diagram 68 representing the MASTER program is shown in FIG. 6. The program for the SLAVE processor is entitled SLAVE. A flow diagram 69 representing the SLAVE program is also shown in FIG. 6. Annotated source code listings of the MASTER and SLAVE programs are included in Appendix I.

It is advantageous to mount the transmitters (i.e., the light emitting diodes) in the aforementioned holders in a manner such that each transmitter is recessed by approximately 40 mm within a respective hole in one of the holders so as to provide a certain degree of collemation of the light beam emitted by the transmitter. It is noted, however, that each light beam may overlap more than one receiver in the opposing holder, since the Master and Slave processors are each programmed to be responsive to only one receiver at a time receiving a respective coded signal from its corresponding transmitter.

The specific embodiment described herein is merely illustrative and is susceptible to modification and alteration in form and detail without departing from the spirit and scope of the invention as defined by the following claims. For example, the Master and Slave processors need not be implemented with integrated circuit microprocessors but may comprise other types of processors capable of being programmed to carry out the necessary functions of the Master and Slave processors.

I claim:

1. A light screen apparatus comprising:

first and second spaced apart holders each having a plurality of light transmitters and light receivers, said plurality of transmitters and receivers being arranged in an alternating arrangement in each of said first and second holders, each of said transmitters in said first holder corresponding to a respective one of said receivers in said second holder and each of said receivers in said first holder corresponding to a respective one of said transmitters in said second holder, each of the transmitters in the first or the second holder being adapted to send a light beam carrying a respective coded signal towards the corresponding respective one of said receivers in the other holder;

a first processor operatively coupled to the transmitter and receivers in the first holder and programmed to sequentially actuate the transmitters and receivers of the first holder in pairs starting with a first pair and to be responsive to the respective coded signal received by the receiver of an actuated pair of the first holder from its corresponding transmitter for actuating the next pair in sequence therein to cause the transmitter of the next pair to send its respective coded signal to its corresponding receiver in the second holder, the first processor being programmed to enter an alarm state and to provide an alarm state signal if the receiver of an actuated pair in the first holder fails to receive the respective coded signal transmitted by its corresponding transmitter during a predetermined interval of time for receiving that coded signal; and a second processor operatively coupled to the transmitters and receivers in the second holder and programmed to sequentially actuate the transmitters and receivers of the second holder in pairs corresponding to the actuation of the transmitter-receiver pairs in the first holder and to be responsive to the respective coded signal received by the receiver of an actuated pair in the second holder from its corresponding transmitter for causing the transmitter of the actuated pair to send its respective coded signal to its corresponding receiver in the first holder and for actuating the next pair in sequence in the second holder, the second processor being programmed to enter an alarm state and to provide an alarm state signal if the receiver of an actuated pair in the second holder fails to receive the respective coded signal transmitted by its corresponding transmitter during a predetermined time interval for receiving that coded signal.

2. A light screen apparatus according to claim 1 wherein the first programmed processor serves as a master processor for initiating the operation of the light screen apparatus by causing the transmitter of the first actuated transmitter-receiver pair in the first holder to send its respective coded signal and the second processor is programmed to serve as a slave processor by being responsive to the receiver of the first actuated transmitter-receiver pair of the second holder receiving the respective coded signal from the transmitter of the first actuated pair of the first holder for causing the transmitter of the first actuated pair in the second holder to send its respective coded signal.

3. A light screen apparatus according to claim 2 wherein the first and second programmed processors respectively actuate the transmitter-receiver pairs in the first and second holders in repetitive cycles.

4. A light screen apparatus according to claim 3 wherein the first programmed processor reinitiates the operation of the light screen following its entry into the alarm state by causing the transmitter of the first actuated transmitter-receiver pair of the first holder to transmit its respective coded signal.

5. A light screen apparatus according to claim 4 wherein the respective coded signals transmitted by the transmitters in the first and second holders are binary coded signals and the second programmed processor causes the transmitter of an actuated pair in the second holder to send a coded signal that is the inverse of a coded signal received by the receiver of the actuated pair the second holder.

6. A light screen apparatus according to claim 5 wherein the first and second processor are substantially identical.

7. A light screen apparatus according to claim 6 wherein the first and second processors each comprise an integrated circuit microprocessor.

* * * * *